(12) United States Patent
Pascucci

(10) Patent No.: US 6,804,756 B2
(45) Date of Patent: Oct. 12, 2004

(54) SYNCHRONIZATION CIRCUIT FOR READ PATHS OF AN ELECTRONIC MEMORY

(75) Inventor: Luigi Pascucci, Sesto San Giovanni (IT)

(73) Assignee: STMicroelectronics S.r.l. (IT)

( * ) Notice: Subject to any disclaimer, the term of this patent is extended or adjusted under 35 U.S.C. 154(b) by 450 days.

(21) Appl. No.: 09/827,369

(22) Filed: Apr. 5, 2001

(65) Prior Publication Data

US 2001/0029575 A1 Oct. 11, 2001

(30) Foreign Application Priority Data

Apr. 10, 2000  (EP) .............................................. 00830269

(51) Int. Cl.[7] .............................................. G06F 12/00
(52) U.S. Cl. .......................... 711/167; 711/105; 711/5; 365/230.03; 365/230.04; 365/233; 713/400; 713/401
(58) Field of Search .............................. 711/105, 5, 167, 711/168, 154; 365/230.03, 230.04, 233; 713/400, 401

(56) References Cited

U.S. PATENT DOCUMENTS

| 5,291,580 | A |   | 3/1994 | Bowden, III et al. | 395/425 |
| 5,526,311 | A |   | 6/1996 | Kreifels et al. | 365/201 |
| 5,559,990 | A | * | 9/1996 | Cheng et al. | 711/157 |
| 5,696,917 | A |   | 12/1997 | Mills et al. | 395/401 |

OTHER PUBLICATIONS

EPO: European Search Report EP 00 83 0269, Aug. 9, 2000.

* cited by examiner

Primary Examiner—Hong Kim
(74) Attorney, Agent, or Firm—Jenkens & Gilchrist, P.C.

(57) ABSTRACT

The present invention relates to a synchronization circuit and method for allowing two or more successive read processes of a memory to be activated simultaneously without destroying the paths or the data. Two independent read processes are mutually independent while active, and are synchronized with respect to each other. The connection between a plurality of sense amplifiers and an output buffer is also synchronized by protocol conditions. The synchronization circuit further synchronizes the read streams so that an evaluation step is perfomed exclusively on one of the plurality of banks of memory while having a plurality of simultaneous read streams.

16 Claims, 4 Drawing Sheets

SYNCHRONIZATION CIRCUIT FOR READ PATHS OF AN ELECTRONIC MEMORY

TECHNICAL FIELD

The present invention relates to a synchronization circuit for read paths of an electronic memory, particularly a non-volatile memory, organized into two separate memory banks.

DESCRIPTION OF THE RELATED ART

It is known that conventional non-volatile memories have, in their fundamental structure, a single memory matrix which can be addressed and read.

The memory read processes are performed one after the other in a mutually exclusive manner, i.e., never simultaneously.

Two successive read cycles in fact could not be activated simultaneously, since their temporal overlap would entail the mutual destruction of the paths (which would compete with each other) and of the data (which would tend to conflict).

This is evident, and accordingly conventional non-volatile memories are managed so as to produce a single read signal stream at a time.

Although this procedure is simple and reliable, it is slow for certain applications which require high performance in terms of memory read speed.

The read performance of the conventional approach is in fact evidently limited not only by factors linked to the technology, but also by the need to disallow read speeds higher than the fastest complete propagation of all the signals of the read stream of a memory read cycle.

SUMMARY OF THE INVENTION

The present invention solves the drawbacks of the aforementioned techniques by organizing non-volatile memories into two separate banks to develop a so-called interleave read mode.

This mode, which is the subject of co-pending patent applications in the name of this same Applicant, is carried out by starting two separate and mutually independent read processes and keeping them active.

In general, the timing stimulus for starting the two read processes occurs, under the supervision of an external control signal (RD), at separate times which are mutually spaced in the so-called burst mode. The two main intervals of a read cycle, i.e., the pre-charging step and the step for evaluating the data item to be read, can be performed without necessarily being mutually exclusive as regards the evaluation step.

However, in order to avoid malfunctions due to noise, it is necessary to provide synchronization of the read steps, so as to perform the evaluation in an exclusive manner on just one of the two memory banks. It is also necessary to synchronize the connection between the sense amplifier and the output buffer, subjecting it to the control of the memory bank that has been evaluated and making its communication dependent on the protocol conditions.

The present invention is to provide a synchronization circuit for read paths of an electronic memory which allows to synchronize the read streams so as to allow the evaluation step exclusively on one of the two banks into which an electronic memory is divided, although having two simultaneous read streams.

BRIEF DESCRIPTION OF THE DRAWINGS

Further advantages of the present invention will become better apparent from the description of a preferred but not exclusive embodiment of the synchronization circuit according to the invention, illustrated only by way of non-limitative example in the accompanying drawings, wherein.

DETAILED DESCRIPTION OF THE DRAWINGS

Figure 1:
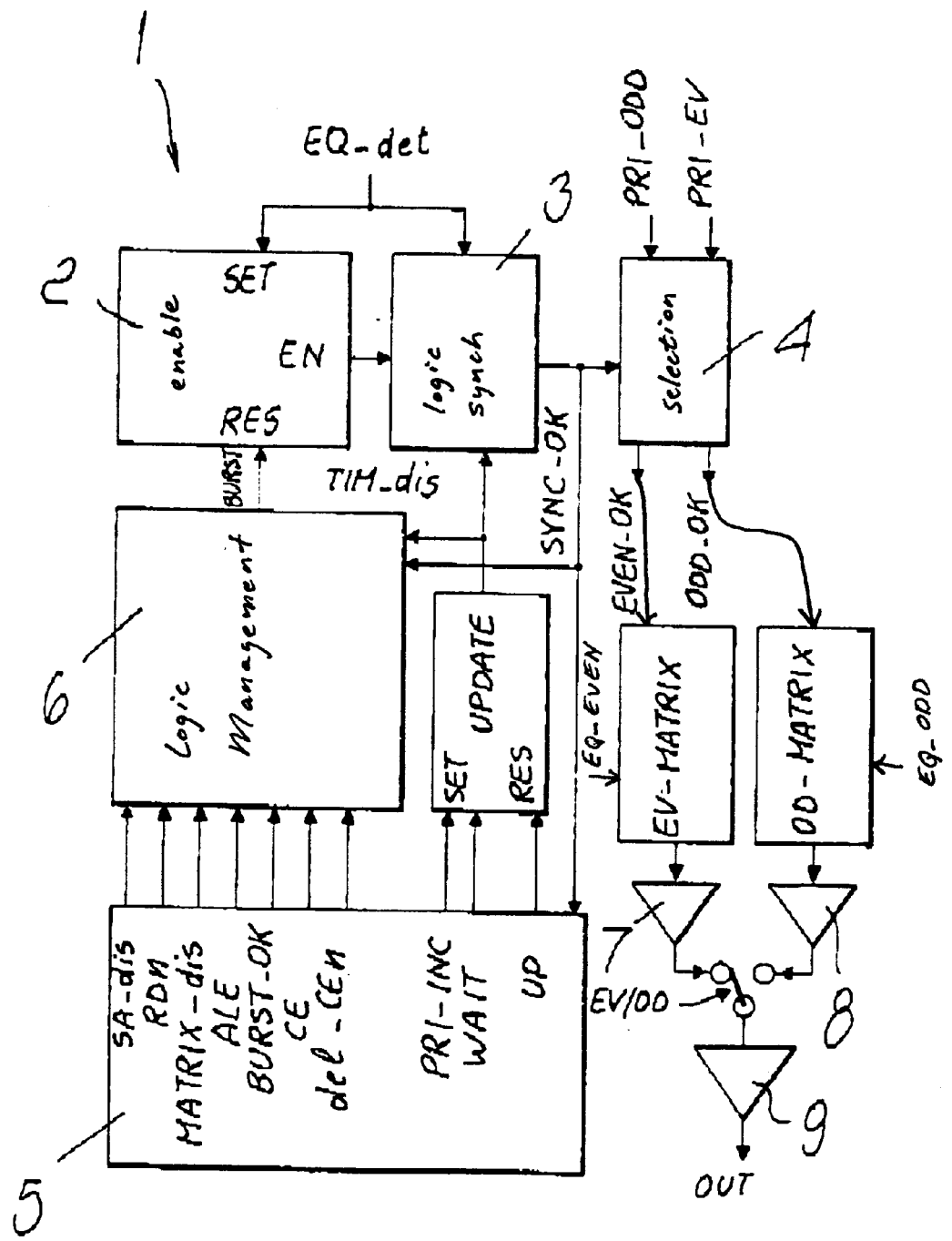
FIG. 1 is a block diagram of a circuit for managing the connection between the sense amplifier and the output buffer in an electronic memory which uses a synchronization circuit according to the present invention.

With reference therefore to the above-cited figures, and initially with reference to FIG. 1, the synchronization circuit for read paths of an electronic memory comprises a network for managing the connecting path between the sense amplifier and the output buffer.

Said network, designated by the reference numeral 1, is controlled by the equalization management network (not shown), which generates a synchronization signal for activation, EQ-det, which is sent in input simultaneously to enabling device 2 for enabling the even and odd memory banks (EV/OD), which are connected to a logic synchronization device 3, which is in turn connected to a selection device 4 which receives, in input, the priority signals PRI-OD and PRI-EV of the odd and even banks, respectively, of an electronic memory which is divided into two separate memory banks.

A cyclic reset unit 10 and the timing device 5 of the memory provide the timing for the various driving signals of the enabling device 2, logic synchronization device 3, and selection device 4 by virtue of a logic management device 6.

In particular, the timing device 5 comprises as output:

a sense amplifier disable signal SA-dis;
a memory read signal RD-n;
a read address latch enable signal ALE;
a memory matrix disable signal Matrix-dis;
a signal Burst-ok for indicating sequential reading;
a chip enable signal CE;
a signal del-CEn which delays the execution of the standby activities with respect to the external request, in order to allow completion of the recovery activities;
a signal PRI-INC which indicates completion and therefore suspension of the read activities.

The cyclic reset unit 10 allows to monitor the protocol conditions for the activation of the update paths. The paths are enabled whenever WAIT=0 and disabled whenever the timing device 5 produces the signal PRI-INC (bank switch) as a completion of a read cycle. The cyclic reset unit 10 also produces a read process suspend signal Tim-dis.

The logic synchronization device 3 emits a synchronization signal SYNC-OK, which is sent to the selection device 4, the timing device 5, and the logic management device 6.

The selection device 4 in turn emits a signal EVEN-OK and a signal ODD-OK for selecting respectively the even memory block (EVEN) and the odd memory block (ODD) for the purpose of reading the memory.

The above-cited signals, EVEN-OK and ODD-OK, are then sent to respective sense amplifiers 7 and 8 which, on the basis of an even or odd memory block enable signal, are connected to an output buffer 9 of the memory in order to emit an output signal at the terminal OUT.

When the signal SYNC-OK is 0, the connection between the sense amplifiers 7 and 8 and the output buffer 9 is interrupted.

The signals PRI-OD and PRI-EV are the signals that allow to alternate the pre-charge and evaluation steps on two memory banks.

Figure 2:
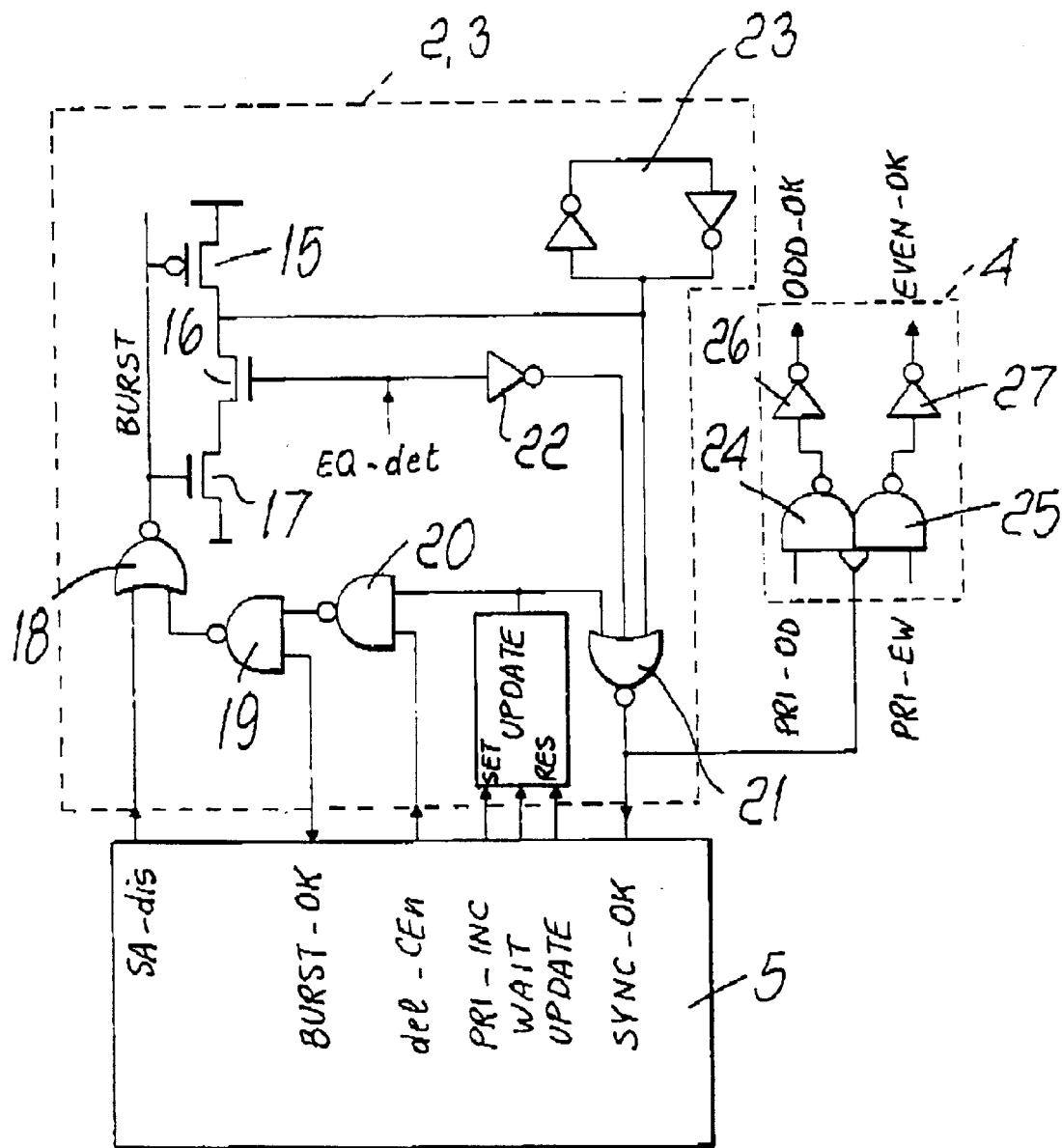
FIG. 2 is a schematic circuit diagram which corresponds to the block diagram of FIG. 1.

FIG. 2 is a circuit diagram of the network for managing the connection between the sense amplifier and the output buffer of FIG. 1.

In detail, the signal EQ-det enables the starting of the pulse ODD-OK and EVEN-OK (if the signal TIM-dis produced by the cyclic reset unit 10 is not at the logic level 1) and is fed to the enabling device 2 and logic synchronization device 3 shown in FIG. 1, which comprise a first P-channel channel MOS transistor 15 which is series-connected to a second N-channel MOS transistor 16, which is in turn series-connected to a third N-channel MOS transistor 17 which is connected to the ground.

The base terminals of the MOS transistors 15 and 17 receive in input the output of a NOR gate 18 which receives, as its first input, the signal SA-dis that arrives from the timing device 5 and, as its second input, the output of a NAND gate 19 which receives the signal Burst-ok as its first input and the output of a second NAND gate 20 as its second input. The NAND gate 20 receives in input the signals del-CEn and Tim-dis, respectively.

The signal Tim-dis is further sent in input to a second NOR gate 21, which emits in output the signal SYNC-OK, which is sent to the selection device 4 and to the timing device 5. The second NOR gate 21 is a three-input gate, in which the second input is the signal EQ-det, which is inverted after passing through an inverter 22. The third input of the NOR gate 21 is constituted by the signal taken at the node that mutually connects the MOS transistors 15 and 16. This signal is further sent in input to a latch circuit 23.

The selection device 4 instead comprises a pair of NAND gates 24 and 25, each of which receives in input the signal SYNC-OK. The gate 24 also receives in input the signal PRI-OD and the gate 25 receives the signal PRI-EV.

The outputs of the gates 24 and 25 are respectively sent to inverters 26 and 27, whose outputs are, respectively, the signals ODD-ok and EVEN-ok.

Figure 3:
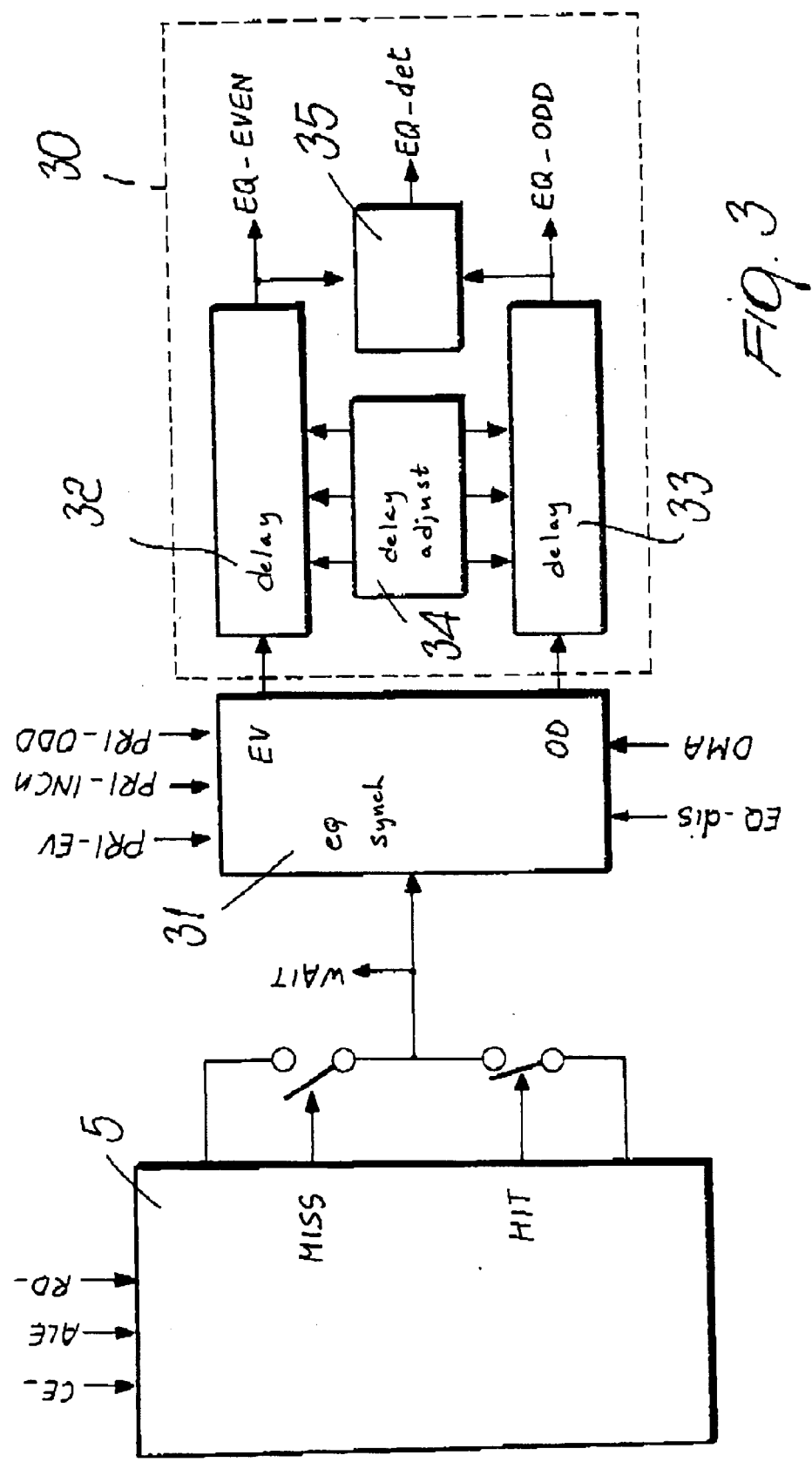
FIG. 3 is a block diagram of an equalization management circuit used in the electronic memory with synchronization according to the present invention.

FIG. 3 shows the equalization management network 30, which is adapted to produce the signal EQ-det for activating the management network 1 for connection between the sense amplifier and the output buffer.

The equalization management network 30 operates according to the signals that arrive from the timing device 5, which are managed by an equalization synchronization device 31. Equalization synchronization device 31 receives, in input, the even memory bank priority signal PRI-EV, the odd memory bank priority signal PRI-ODD, the signal PRI-INCn for forcing both memory banks to pre-charge (when signal PRI-INCn is at logic 0), the signal EQ-dis for disabling the equalization step so as to force the memory from outside the memory, for special functions, and the direct memory access signal DMA, which is also used for special functions.

The timing device 5 receives, in input, the chip enable signal CE, the address latch enable signal ALE, and the read signal RD. These input signals are then sent to the logic management device 6, as shown in FIG. 1.

The timing device 5 selects a read mode path depending on whether one intends to perform a random read or sequential reads. The signal Miss indicates the enabling of a random read path, while the signal Hit indicates the enabling of a sequential read mode path.

The first read path, the random one, requires the generation of an appropriate delay, while the sequential read path requires no delay and on the contrary must be as immediate as possible.

Once the random or sequential memory read path has been selected, the timing device 5 produces the signal WAIT, which by keeping both EQ-EV and EQ-ODD at the logic level "1" sets and keeps both memory banks in the pre-charge mode, prevents the reading of the signal EQ-det by forcing TIM-dis to "1", and does not allow updating of the output buffer 9, thus ensuring the integrity of the last data item read from the memory, throughout the period of validity of the WAIT condition.

The WAIT condition is set at every beginning of a new cycle, at every end of the reading of a bank and in general at every standby or suspend condition. WAIT is instead removed at each read request accompanied by an update condition (RDn=0) by means of the signal UP generated by the logic management device 6.

The equalization management network 30 then generates, by being driven by the equalization synchronization device 31, a delay of the equalization step of the even memory bank, block 32, and a delay for the equalization step of the odd memory bank, block 33.

The delays of the equalization steps of the even and odd memory banks are adjusted appropriately by adjustment device 34, and data evaluation sense device 35 senses the outputs of the blocks 32 and 33 in order to generate the signal EQ-det for activating the network for managing the connection between the sense amplifier and the output buffer.

Locking to the protocol conditions (verification of Rdn=0) is performed by systematically deactivating the reading of EQ-det on the path sync-ok. In greater detail, at each completed read operation, the connected pulse PRI-INC forces TIM-dis=1, thus forcing the NOR gate 21 to 0. This condition excludes the reading of EQ-det and simultaneously forces SYNC-OK=0. The blocking condition is removed when (after the PRI-INC pulse has elapsed) the control signal Rdn assumes a low level (RDn=0). The prolonged absence of this condition extends accordingly the blocking condition and the updating of the data item to be viewed with the buffer and the alternation of the read operations between the two banks.

Figure 4:
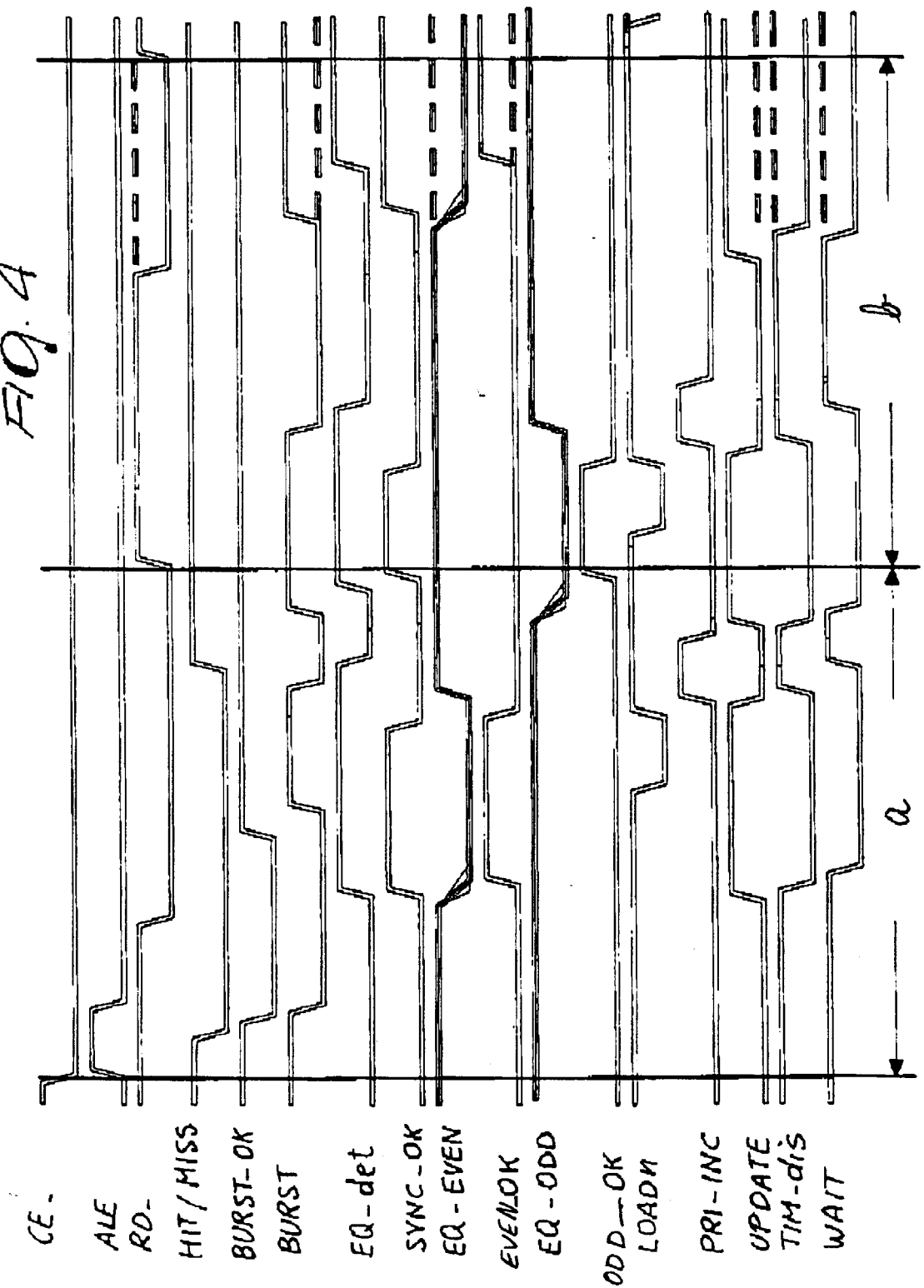
FIG. 4 is a chart of the timings of some of the signals involved in the synchronization circuit according to the present invention.

The time chart of FIG. 4 plots the various signals of the memory.

The chart of FIG. 4 is divided into two portions, of which portion a shows a read cycle of the random type, while portion b shows a read cycle of the sequential type.

The random read cycle is always the initial read cycle of the memory and can be followed by one or more sequential read cycles.

With reference therefore to FIG. 4, it can be noted that the transition of the signal CE from high to low and the subsequent transition of the signal ALE from low to high (indicating an address latch enabling) entails the transition of the signal Hit/Miss from high to low, thus indicating a random cycle, which when the memory read signal RD transitions to logic 0 produces and/or asserts the signal EQ-det, which activates the connection between the sense amplifier and the output buffer.

Prior to the activation/assertion of the signal EQ-det, the pre-charge step is activated, even simultaneously for the two even or odd memory banks, subsequently starting the step for evaluation in an exclusive manner on the two memory banks. In this case, in the cycle a of FIG. 4, the signal EQ-EVEN becomes low, while the signal EQ-ODD remains high. The speed of the drop of the signal EQ-EVEN is determined by the delay set by the delay device 32, which accordingly generate the signal EQ-EVEN.

After the drop of the signal EQ-EVEN, the output data load signal (LOADn) is generated.

At the end of said signal LOADn, the signal PRI-INC is raised. At the falling edge of signal PRI-INC, the signal EQ-ODD becomes low, shifting the activity of the memory to the odd bank.

It is important to note that the evaluation of the bank ODD (EQ-ODD=1) is intentionally delayed with respect to the pulse LOADn by means of an increment interval, in order to start reading on the bank ODD only at the end of the transitions of the outputs, which notoriously cause read circuit failures.

The signal WAIT instead changes state upon the change of state of the signal EQ-EVEN or of the signal EQ-ODD, under the action of PRI-INC, which simultaneously also deactivates the network of SYNC-OK. This action presets the condition for monitoring compliance with the protocol for each read cycle.

Substantially, the equalization management network is provided with modulability and trimmability characteristics, in order to maximize the sensitivity of the sense amplifier circuits, and:

configures the (optionally simultaneous) pre-charging on two memory banks;

starts evaluation exclusively on one of the two memory banks;

produces the evaluation signals in a manner which allows modulation, with adequate delays, in order to facilitate data item capture;

paces the evaluation time with delays which depend on the read mode of the memory;

synchronizes the timing with the data capture step (EQ-det);

alternates the change of activity on the even and odd memory banks synchronously at the end of an update of one of the two counters of the memory banks;

subjects the synchronization activities to the protocol conditions;

handles system suspend requests; and avoids noise conditions for the sake of reliability and success of the reading operation.

The timing device 5 selects the sequential or random cycle mode path;

generates the appropriate delays for the two mode paths;

forces and keeps both banks in the pre-charge step (WAIT=1); and delays the data item capture activities.

The signal PRI-INCn, set equal to 0, allows to force both memory banks to the pre-charge mode, while the pre-charge and evaluation steps are alternated on two memory banks in accordance with the control signal PRI-EV and PRI-ODD (when these signals are high and in the evaluation step).

Moreover, control signals EQ-dis and DMA for special functions are present. When both of these signals are high, the signals EQ-EVEN and EQ-ODD are low.

The network for managing the path for connection between the sense amplifier and the output buffer is instead synchronous with the equalization network by means of the signal EQ-det, is created with the characteristic of producing pulsed signals, and:

interrupts the dialog between the sense amplifier 7, 8 and the output buffer 9 (when SYNC-OK=0);

selects which, between the even and odd banks of the memory, must update the output buffer 9;

ensures favorable read contexts for assured updates;

resets the protocol monitoring conditions.

For this network for managing the connecting path between the sense amplifier and the output buffer, the activities are performed under the control of the equalization management network, which as mentioned generates the synchronization signal for activation, EQ-det, and the signal PRI-ODD or the signal PRI-EV, which select the path for connection between the sense amplifier related to the evaluated memory bank and the output buffer 9.

Moreover, the timing device 5 manages the network 1 to allow disabling, synchronous and asynchronous enablings, define the duration of the control pulses, EVEN-OK and ODD-OK, and allow the standby configuration of the memory.

The new evaluation of the second memory bank can occur only at the end of the updating of the counter related to the first bank that has just been read. This allows to avoid negative influences of the noise generated by the memory on the nodes of the sense amplifier.

In practice it has been observed that the synchronization circuit according to the invention provides synchronization between two banks of a memory, for operation of the interleave type, with data reads performed in a time-flexible manner, depending on the type of random or sequential read path chosen, or in a conventional manner.

The synchronization circuit thus conceived is susceptible of numerous modifications and variations, all of which are within the scope of the inventive concept; all the details may furthermore be replaced with other technically equivalent elements.

What is claimed is:

1. A synchronization circuit comprising:
   a memory being divided into a plurality of separate banks, said memory comprising:
      at least one sense amplifier for each bank;
      at least one counter for each bank; and
      an output buffer;
   a first network for generating a synchronization signal which controls updating of said output buffer of said memory; and
   a second network for managing, in response to receiving said synchronization signal, a connection path between said sense amplifiers and said output buffer, said second network comprising a timing device for determining the read mode of said memory, wherein said connection path is selected by priority control signals.

2. The circuit according to claim 1, wherein said plurality of banks comprises:
   an EVEN memory bank having memory cells corresponding to even-numbered addresses; and
   an ODD memory bank having memory cells corresponding to odd-numbered addresses.

3. The circuit according to claim 1, wherein said first network comprises:
   an equalization synchronization device adapted to receive said priority control signals and generate one or more signals based upon said priority control signals; and a data evaluation sensor adapted to generate said synchronization signal and send said synchronization signal to said second network based upon said one or more signals generated by said equalization synchronization device.

4. The circuit according to claim 3, wherein said first network further comprises:

at least one delay device adapted to generate a time delay for a duration of an equalization portion of a memory access operation of said separate memory banks; and an adjustment device adapted to adjust said time delay.

5. The circuit according to claim 3, wherein said equalization synchronization device further receives external control signals which are adapted to enable auxiliary functions of said memory.

6. The circuit according to claim 1, wherein said second network further comprises:

a selection device adapted to receive said priority control signals and, in response to said priority control signals, generate a control signal for activating said connection path between the sense amplifier and the output buffer related to said memory bank whose data is to be loaded into said output buffer;

a logic synchronization device adapted to receive said synchronization signal and, in response, generate a second synchronization signal for driving said selection device; and a logic management device adapted to manage a plurality of signals from at least one of said timing device and said selection device.

7. The circuit according to claim 1, wherein said timing circuit is adapted to generate, following the selection of the read mode of said memory, a wait signal for maintaining said memory banks in a pre-charge condition, without enabling the updating of said output buffer of the memory.

8. The circuit according to claim 1, wherein said timing circuit is adapted select between a random-type cycle, a sequential-type cycle, and a conventional type cycle for reading said memory.

9. The circuit according to claim 1, wherein said timing circuit is driven by a chip enable signal, a read address latch enable signal, and a read signal of said memory.

10. The circuit according to claim 6 further comprising an enabling device adapted to enable said two separate banks.

11. A method for reading data from a plurality of memory banks of a memory, said method comprising the steps of:

latching an address value;

generating one or more synchronization signals;

synchronously connecting, in response to receiving a first of said synchronization signals, a selected data path between a first one of said memory banks and an output buffer of said memory; and synchronously connecting, in response to receiving a second of said synchronization signals and prior to latching another address value, a selected data path between a second one of said memory banks and said output buffer.

12. The method according to claim 11, comprising the additional steps of:

initially selecting a sequential read operation, said synchronously connecting steps being based upon said selecting of a sequential read operation.

13. The method according to claim 11, wherein said step of connecting a selected data path between said second one of said memory banks and said output buffer comprises delaying said connecting for a predetermined period of time.

14. The method according to claim 13, wherein said delaying further comprises adjusting said predetermined period of time.

15. The method of claim 11, further comprising:

following said step of synchronously connecting said selected data path between said first one of said memory banks and said output buffer, incrementing a counter associated with said first one of said memory banks.

16. The method of claim 11, further comprising:

following said step of synchronously connecting said selected data path between said second one of said memory banks and said output buffer, incrementing a counter associated with said second one of said memory banks.

* * * * *